(12) United States Patent
Pai

(10) Patent No.: US 7,892,441 B2
(45) Date of Patent: Feb. 22, 2011

(54) METHOD AND APPARATUS TO CHANGE SOLDER PAD SIZE USING A DIFFERENTIAL PAD PLATING

(75) Inventor: Deepak K. Pai, Burnsville, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 751 days.

(21) Appl. No.: 11/806,598

(22) Filed: Jun. 1, 2007

(65) Prior Publication Data

US 2008/0296253 A1 Dec. 4, 2008

(51) Int. Cl.
*H01B 13/00* (2006.01)
*H01K 3/10* (2006.01)

(52) U.S. Cl. .......................................... 216/18; 29/852
(58) Field of Classification Search .............. 216/13, 216/18, 41, 58, 83; 257/E23.067, 700; 439/68; 29/852, 842, 846, 825; 438/689
See application file for complete search history.

(56) References Cited

U.S. PATENT DOCUMENTS

| | | | |
|---|---|---|---|
| 5,352,926 A | 10/1994 | Andrews | |
| 5,873,161 A | 2/1999 | Chen et al. | |
| 6,050,832 A | 4/2000 | Lee et al. | |
| 6,379,159 B1 | 4/2002 | Mune et al. | |
| 6,400,018 B2 | 6/2002 | Clatanoff et al. | |
| 6,516,513 B2 | 2/2003 | Milkovich et al. | |
| 6,591,491 B2 | 7/2003 | Fujii et al. | |
| 6,662,442 B1 | 12/2003 | Matsui et al. | |
| 6,774,315 B1 | 8/2004 | Pierson et al. | |
| 6,904,674 B2 | 6/2005 | Mune et al. | |
| 6,946,329 B2 | 9/2005 | Pierson et al. | |
| 7,105,918 B2 | 9/2006 | Lee | |
| 2005/0023699 A1* | 2/2005 | Ahn et al. | 257/762 |
| 2006/0022328 A1* | 2/2006 | Lee | 257/698 |
| 2006/0094159 A1 | 5/2006 | Lee | |
| 2006/0175699 A1 | 8/2006 | Lee | |
| 2006/0191133 A1 | 8/2006 | Nakao et al. | |
| 2006/0238207 A1* | 10/2006 | Egitto et al. | 324/754 |

OTHER PUBLICATIONS

Nunno, T.; Palmer, S.; Arienti, M.; Breton, M. Toxic Waste Minimization in the printed Circuit Board Industry. Pollution Technology Review No. 162. Bites Data Corporation. 1988, p. 56.*
UK Intellectual Property Office, "Patents Act 1977: Search Report under Section 17(5)," Sep. 1, 2008.

* cited by examiner

*Primary Examiner*—Binh X Tran
*Assistant Examiner*—Patti Lin
(74) *Attorney, Agent, or Firm*—Steptoe & Johnson LLP

(57) ABSTRACT

A method of manufacturing an interposer is provided, including the steps of providing a sheet with a copper layer and polyimide layer, laser drilling holes in the polyimide layer down to the copper layer, filling the holes with copper and extending the copper above the polyimide layer to define caps, removing portions of the copper layer to form conductive pads, and filling gaps between the conductive pads with an insulator, wherein individual conductive pads are in electrical contact with corresponding individual caps.

21 Claims, 9 Drawing Sheets

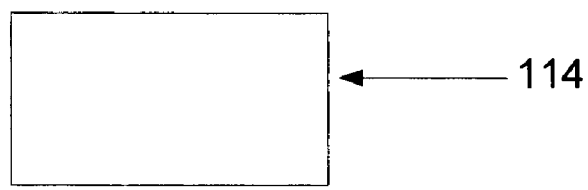
Fig 1(a)
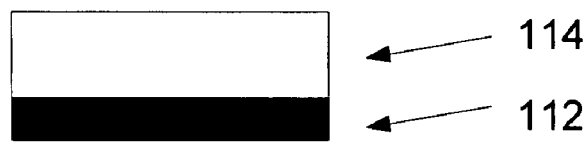
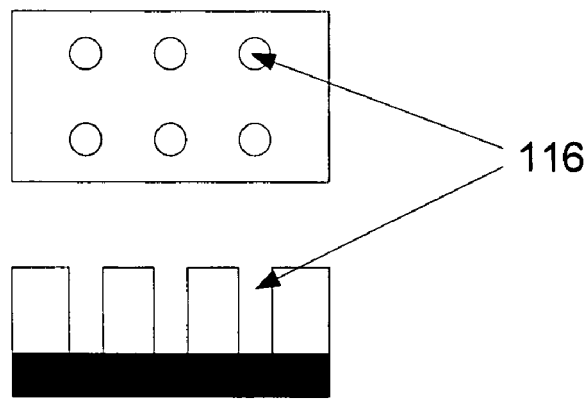
Fig 1(b)
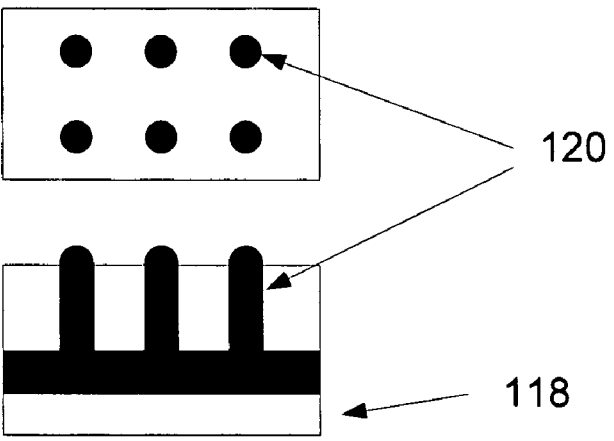
Fig 1(c)

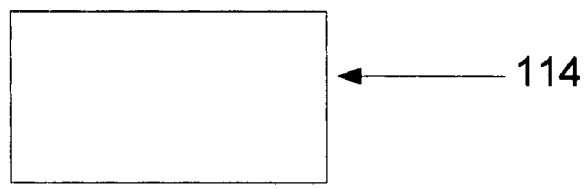
Fig 2(a)
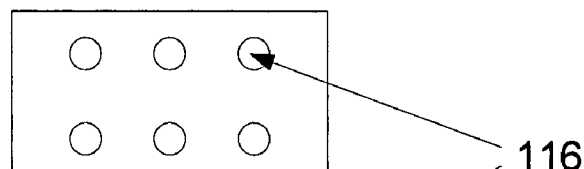
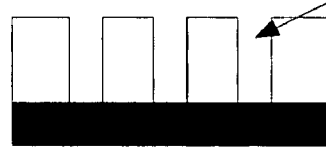
Fig 2(b)
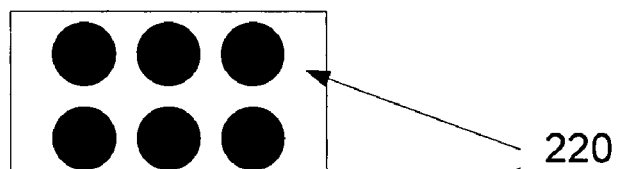
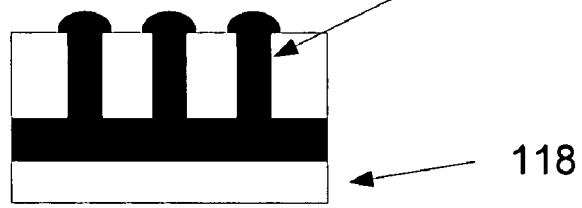
Fig 2(c)

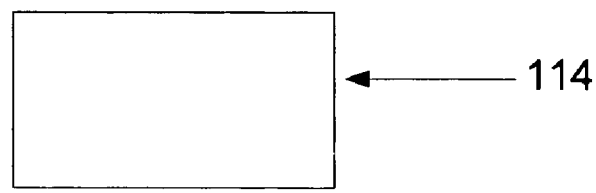
Fig 3(a)
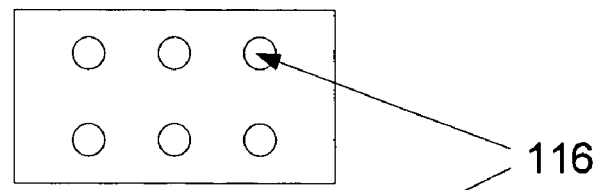
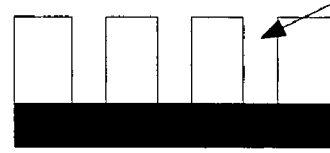
Fig 3(b)
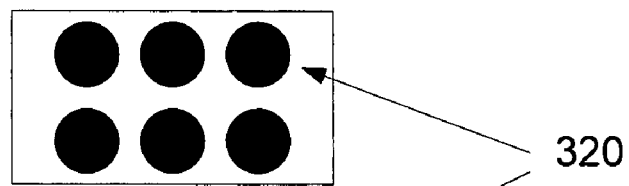
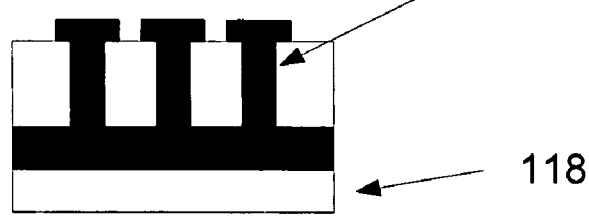
Fig 3(c)

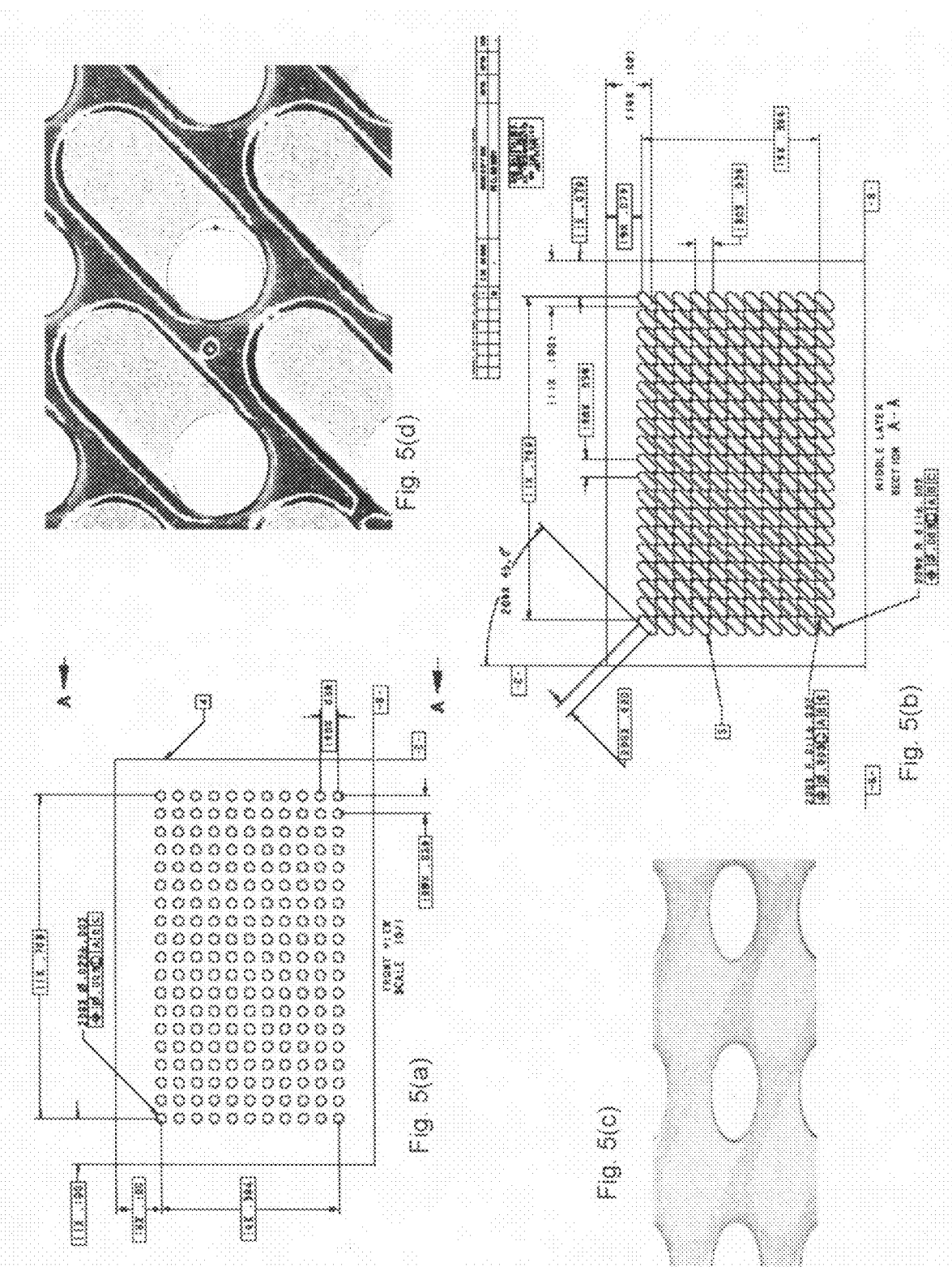

METHOD AND APPARATUS TO CHANGE SOLDER PAD SIZE USING A DIFFERENTIAL PAD PLATING

BACKGROUND OF THE INVENTION

1. Field of the Invention

The present invention relates to interposers for connecting land grid array components. More specifically the present invention relates to an interposer with conductors disposed at a small pitch.

2. Discussion of Background Information

Circuit boards ordinarily include circuit patterns or traces printed on various levels internal to the board and/or on one or both sides of the board. Components are ordinarily mounted on one side of the board and electrically connected to the circuit patterns. Prior to the introduction of surface mount and land grid array components, it was common to mount components to a circuit board and extend leads from the components through plated holes in the circuit board to mounting pads on the opposite side. The plated-through holes were electrically connected to the desired locations on the circuit pattern. The component leads were ordinarily arranged in a pattern along the edges of the component with the ends of the component leads soldered to the pads on the opposite side of the board to establish mechanical and electrical connection to the board and circuit pattern.

Surface mounted components were developed for mounting and connecting to one side of the board. In one form of surface mounted components, leads extend from along the edges of the component for attachment to pads on the circuit board. In another form of surface mounted components, compliant leads were attached to pads along the edges of the component and to pads on the circuit board.

Land grid array components are a class of surface mounted components that employ a grid array of solder connections on a surface of a component. The solder connections of the grid array are not limited to the edges of the component, but instead are dispersed across the surface in spaced relation in an area array that is usually uniform. Land grid array components include ball grid array components, solder grid array components and column grid array components. The surface bearing the land grid array is positioned to confront an identical grid array of circuit pads on a circuit board, and solder beads, balls or columns are heated to reflow to attach or detach the component from the circuit board.

One difficulty with land grid array attachment techniques is that inspection of the solder connections cannot always be accomplished. More particularly, while solder beads and connections at the edges of the array might be visually inspected, it has been difficult to inspect connections at the interior of the array.

To overcome the above drawbacks, U.S. Pat. No. 5,953,816 provides a flexible interposer that would allow for laser drilling of holes for conductive materials, where the electrical connections were at a 0.040-0.050 inch pitch. In the intervening ten years since the '816 patent was filed, technical advancements have reduced the pitch between holes to about 0.012-0.022 inches. It is difficult to apply the techniques of the '816 patent to this smaller pitch size because the polyimide mask concentrates stress on the solder joints between the interposer and the attached electrical components.

SUMMARY

According to an embodiment of the invention, a method of manufacturing an interposer is described. The method includes the steps of providing a sheet with a copper layer and polyimide layer; laser drilling holes in the polyimide layer down to the copper layer; filling the holes with copper and extending the copper above the polyimide layer to define caps; removing portions of the copper layer to form conductive pads; and filling gaps between the conductive pads with an insulator; wherein individual conductive pads are in electrical contact with corresponding individual caps.

The above embodiment may have various optional features. The holes can be overfilled such that excess copper extends outwardly on the polyimide layer to form substantially mushroom shaped caps. The copper extensions can have a substantially circular cross section and the conductive pads can have a substantially capsule shaped cross section. The diameter of the holes can be approximately 0.002 inches less than a minimum pitch between the holes. The diameter of the holes can be at least approximately 0.002 inches less than a minimum pitch between the holes. The diameter of the extended copper can be between about 40-60% greater than a diameter of the holes, and the diameter of the mushroom cap can be between about 40-60% greater than a diameter of the holes.

The copper extensions can have a substantial circular cross section and the conductive pads can have a substantially capsule shaped cross section. The copper extension can be centered on the holes, and the conductive pads can be off center from the holes. Extending the copper can include forming a substantially cylindrical portion of copper above each of the holes to form a flat cap. Additionally, a photoresist layer having recesses centered above the holes can be provided on the polyimide layer; the recesses have a diameter larger than that of the holes, such that the filing step fills said holes and recesses to form flat caps.

According to another embodiment of the invention, a method of manufacturing an imposer is provided. The method includes the steps of providing a sheet with a conductor layer and an insulating layer; drilling holes in the insulating layer down to the conductive layer; applying conductor to selected portions of the sheet to fill the holes and create conductive caps above the insulating layer, the conductive caps having a diameter at least about 40% greater than a diameter of the holes; removing portions of the conductive layer to form conductive pads; and filling gaps between the conductive pads with an insulator; wherein individual conductive pads are in electrical contact with corresponding individual conductive caps through the insulating layer. The conductive caps can be mushroom shaped. The conductive caps can be flat.

The above embodiment may have various optional features. The step of applying conductor to selected portions of the sheet can include applying a photoresist layer to said insulating layer; masking the photoresist layer to create a pattern of caps concentric about the holes; removing a portion of the photoresist layer to create recesses over the holes; and filling the holes and recesses with a conductor. The copper extensions can have a substantial circular cross section, the holes can have a substantial circular cross section along their entire length, and the conductive pads can have a substantially capsule shaped cross section. The copper extensions can be centered on the holes, and the conductive pads can be off center from the holes. The insulating layer can be polyimide. The conductive layer can be copper.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIGS. 1(a)-1(f) illustrate top and side views of the steps for making an interposer according to an embodiment of the invention;

FIGS. 2(a)-2(f) illustrate top and side views of the steps for making an interposer according to another embodiment of the invention;

FIGS. 3(a)-3(f) illustrate top and side views of the steps for making an interposer according to another embodiment of the invention;

FIGS. 5(a)-5(d) are top and bottom views of a completed interposer; and

Figure 1D:
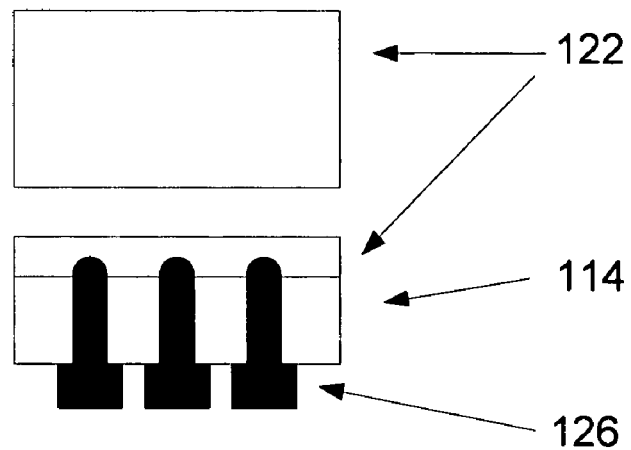

The noted figures are for illustrative purposes and are not drawn to size.

DETAILED DESCRIPTION OF EXEMPLARY EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Referring now to FIG. 1(a), a copper clad polyimide sheet 110 is provided, with the copper layer 112 as the base and the polyimide layer 114 as the top. Copper layer 112 is preferably 0.0028 inches (±0.0014) thick, and polyimide layer 114 is preferably 0.001 inches (±0.001) thick. At this range of thickness, copper clad polyimide sheet 110 is flexible and can thus move to avoid stress on individual connections with adjacent electrical components.

Referring now to FIG. 1(b), the copper clad polyimide sheet is laser drilled to create holes 116 at the desired pitch through the entire polyimide layer 114 to expose the underlying copper layer 112. The diameter of the holes is preferably less than or equal to about 0.002 inches less than the minimum pitch of holes 116. By way of non-limiting example, for a minimum pitch of 0.010 inches, the diameter of holes 116 should be less than about 0.008 inches. This removes an appropriate amount of material from the copper clad polyimide sheet 110 without compromising its structural integrity.

Referring now to FIG. 1(c), a mask 118 is applied over the bottom of copper layer 112. The laser drilled holes 116 are plated to fill the hole and extend the copper in "bumps" 120 above the polyimide layer 114. For the various dimensions discussed above, bumps 120 of plated copper preferably extend about 0.002-0.004 inches over polyimide mask 114. As discussed below, bumps 120 can optionally be enlarged to increase pad width and height.

Referring now to FIG. 1(d), a mask 122 is applied on the top of copper clad polyimide sheet 110 to protect bumps 120. Mask 118 is removed from the bottom of copper layer 112 and replaced with a photo resist 124 having sufficient thickness to form bottom pads. A pad pattern (not shown) shaped to form pads of the desired size is applied to the bottom of photoresist 124. The photoresist 124 is then exposed, and copper layer 112 is etched to form bottom pads 126. The resulting pads 126 are preferably made according to typical component pad dimensions.

Figure 1E:
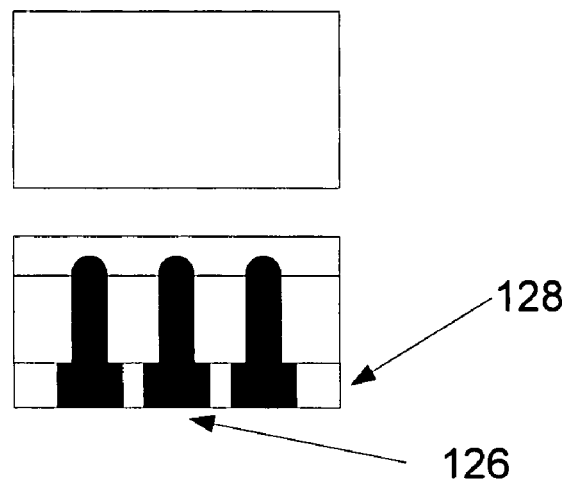

Referring now to FIG. 1(e), a solder mask 128 is applied to the exposed bottom pads 126. A non-solder mask defined pad pattern is printed on solder mask 128, which is then exposed, developed and cleaned to expose the bottom of pads 128 with design clearance dimensions in between individual pads 126.

Figure 1F:
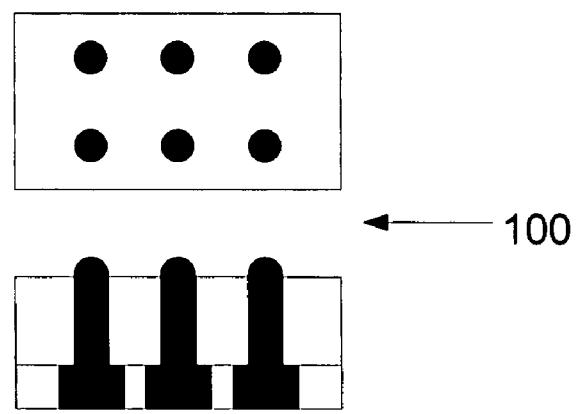
Figure 2D:
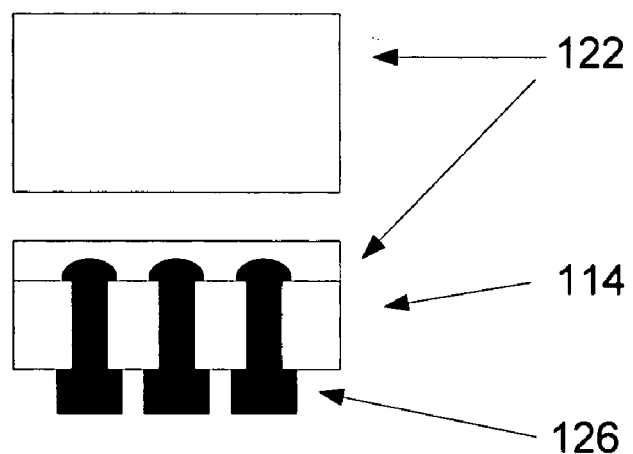
Figure 2E:
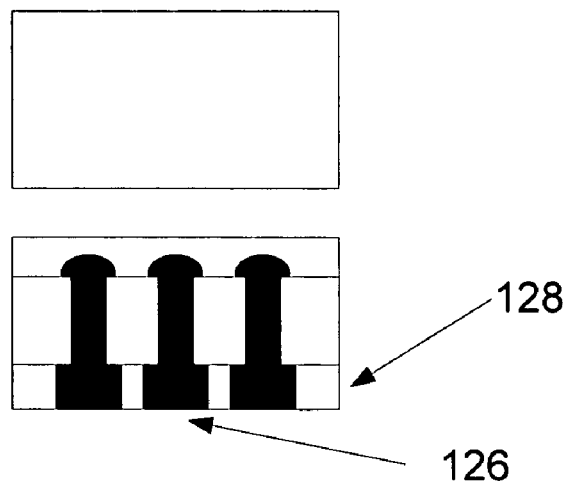
Figure 2F:
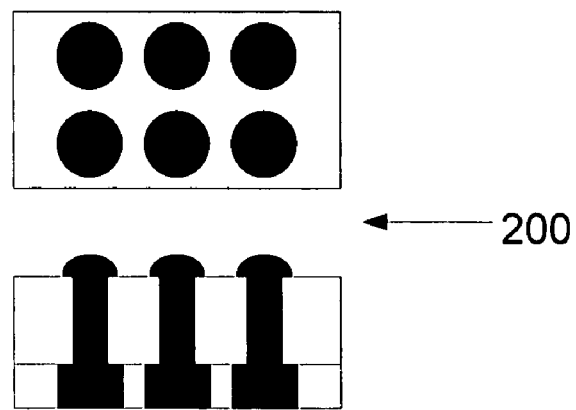
Figure 3D:
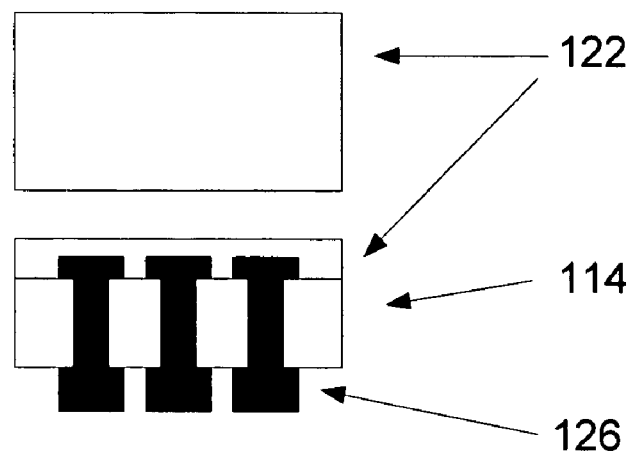
Figure 3E:
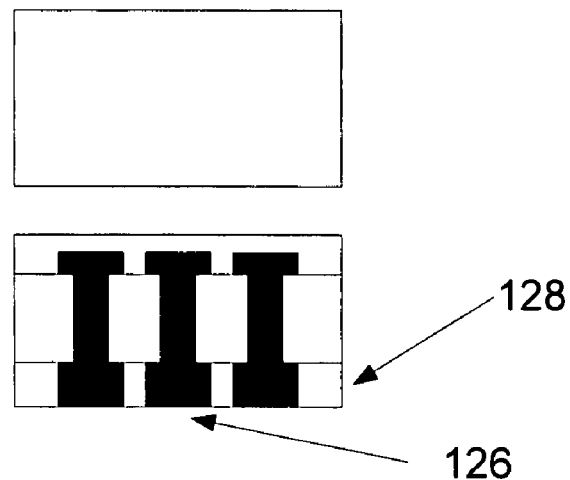
Figure 3F:
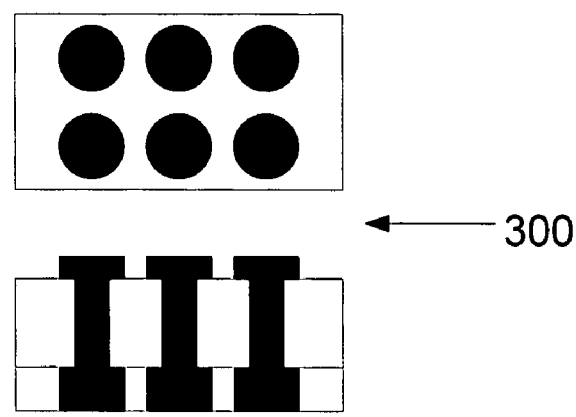

Referring now to FIG. 1(f), mask 122 is removed. The completed interposer 100 is ready for use.

FIGS. 2(a)-2(f) show another embodiment of making an interposer 200. All of the steps are the same as in FIGS. 1(a)-1(f) described above, except that in step 2(c) the holes 116 are over-plated such that the bumps enlarge to form mushroom caps 220. For the various dimensions discussed above, mushroom caps 220 preferably have a diameter about 5% (±10%) larger than the diameter of holes 116, and they preferably extend 0.002-0.004 inches over polyimide mask 114. These mushroom caps 220 provide a larger surface area for connecting to adjacent circuit elements.

FIGS. 3(a)-3(f) show another embodiment of making an interposer 300. All of the steps are the same as in FIGS. 1(a)-1(f) described above, except that step 3(c) entails a more controlled plating process such that the bumps form flat caps 320. For the various dimensions discussed above, mushroom caps 310 preferably have a diameter about 50% (±10%) larger than the diameter of holes 116, and they preferably extend 0.002-0.004 inches over polyimide mask 114. These flat caps 320 provide a larger surface area for connecting to adjacent circuit elements.

Figure 4A:
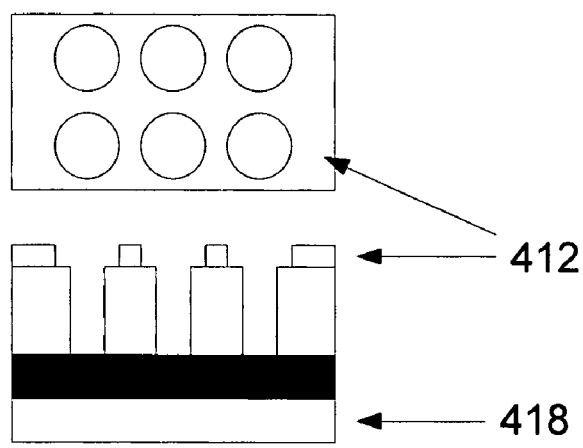
FIGS. 4(a)-(c) illustrate top and side view of the steps for making flat caps in the embodiment shown in FIGS. 3(a)-3(f)
Figure 4B:
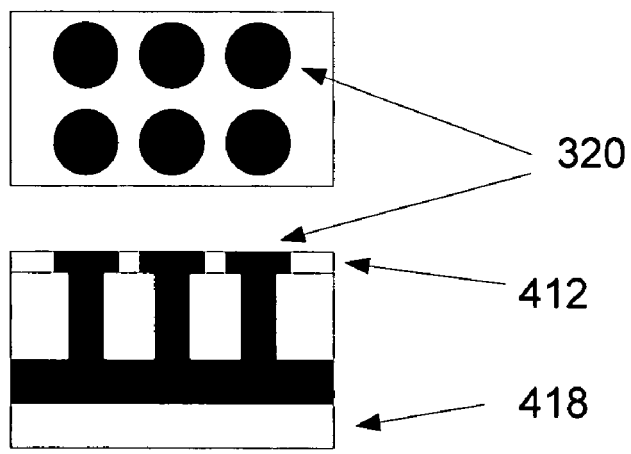
Figure 4C:
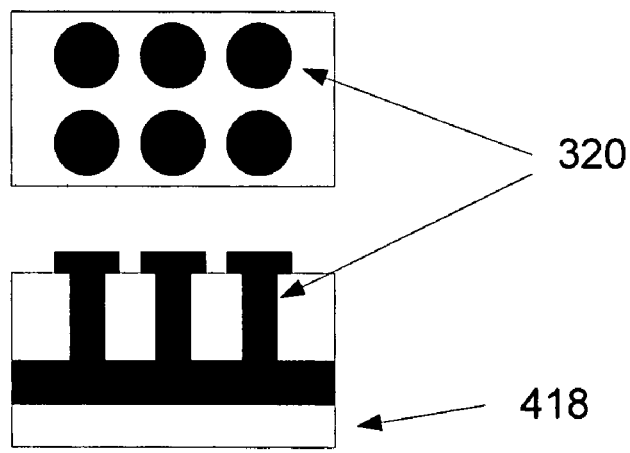

FIGS. 4(a)-4(c) show the steps for making flat caps 320 discussed with respect to step 3(c) above. In FIG. 4(a), a mask 418 is applied to the bottom of copper layer 112, and a photoresist layer 412 is applied to the top of polyimide layer 114. A large pad size mask (not shown) is applied to the photoresist to create the pattern for flat caps 320. The photoresist is then developed to create recesses in photoresist 412 that define the shape of flat caps 320.

In FIG. 4(b), the holes 116 are plated to form the flat caps. In FIG. 4(c), photoresist 412 is removed. The resulting interposer is completed by following the steps shown in FIGS. 3(d)-(f) discussed above.

FIGS. 5(a)-5(d) show examples of the top and bottom views of the completed interposer. FIG. 5(a) is a top view that shows the individual bumps/caps 120/220/320. FIG. 5(b) is a bottom view that shows the oblong capsule shaped bottom pads 126. FIGS. 5(c) and 5(d) show how the holes 116 align with the oblong pads 126, specifically in that each hole preferably is centered on a corresponding end of the oblong pad 126. Placing pads 126 off center related to holes 116 allows any pressure applied to pads 126 to be absorbed by the flexible nature of the copper/polyimide sheet 110 as opposed to passing the stress directly into the copper that fills hole 116.

Figure 6:
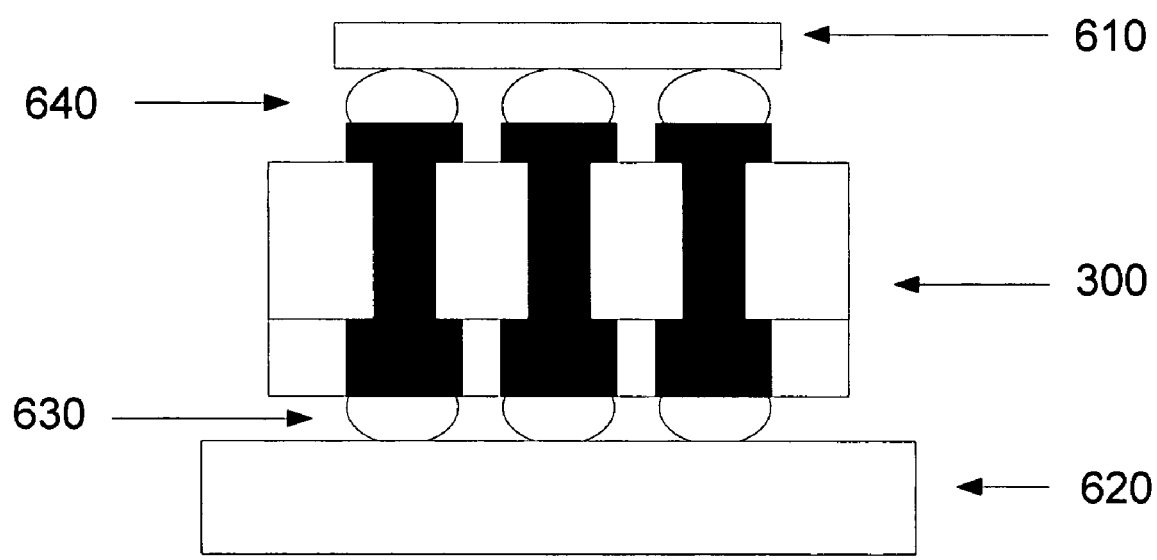
FIG. 6 is a side view of an interposer connected to an electrical component and a printed circuit board.

FIG. 6 shows the interposer 300 connected to an electrical component 610 and a printed wiring board 620. Such components are typically pre-provided with solder balls 630 and 640 in the appropriate locations. Paste (solder paste or flux paste) is applied to the conductive pad regions, and the components are heated to the appropriate temperature to melt the solder and form the electrical connections. Interposers 100 and 200 would be similarly connected.

In the mid-1990s, most solder was made from an alloy of tin and lead. In recent years, concerns over the use of lead have caused a migration in commercial implementations to alloys of silver, copper and tin known as SAC. However, military applications still require a tin/lead alloy in printed wiring board 620. It is therefore preferable—if not likely—that for military applications the solder balls 630 for the printed wiring board 610 will be made of tin and lead, whereas solder balls 640 for electronic component 610 would be made of SAC. To accommodate a potential mismatch in the thermal expansion coefficients, the paste used is specific to the type of solder. Thus a tin/lead based paste is used for solder balls 630, and SAC solder paste for solder balls 640.

While the above embodiments have been described with various materials (e.g., copper, polyimide), the invention is not so limited. Other appropriate materials, conductors and insulators may be used as appropriate.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method of manufacturing an interposer, comprising:
   providing a sheet with a copper layer and polyimide layer;
   laser drilling holes in the polyimide layer down to the copper layer;
   filling the holes with copper and extending the copper above the polyimide layer to define caps having a substantial circular cross-section;
   removing portions of the copper layer to form conductive pads having a substantially capsule-shaped cross-section defined by first and second semicircular end regions and a rectangular region therebetween; and
   filling gaps between the conductive pads with an insulator;
   wherein individual conductive pads are in electrical contact with corresponding individual caps; and
   wherein each of the holes is substantially coaxial with the first semicircular end region of each of the conductive pads, respectively.

2. The method of claim 1, wherein the diameter of the holes is approximately 0.002 inches less than a minimum pitch between the holes.

3. The method of claim 1, wherein the diameter of the holes is at least approximately 0.002 inches less than a minimum pitch between the holes.

4. The method of claim 1, wherein the diameter of the extended copper is between about 40-60% greater than a diameter of the holes.

5. The method of claim 1, wherein the copper extensions are centered on the holes, and the conductive pads are off center from the holes.

6. The method of claim 1, wherein said extending comprises forming a substantially cylindrical portion of copper above each of the holes to form a flat cap.

7. The method of claim 1, further comprising:
   providing a photoresist layer on the polyimide layer, the photoresist layer having recesses centered above the holes, the recess having a diameter larger than that of the holes;
   wherein said filing fills said holes and recesses to form flat caps.

8. The method of claim 1, wherein said filling further comprises overfilling said holes such that excess copper extends outwardly on said polyimide layer to form substantially mushroom shaped caps.

9. The method of claim 8, wherein the diameter of the mushroom cap is between about 40-60% greater than a diameter of the holes.

10. The method of claim 1, wherein the holes and the first semicircular regions have substantially the same diameter.

11. The method of claim 10, wherein:
    the holes define a grid; and
    the conductive pads are aligned in parallel at a non-zero angle to the axes of the grid.

12. A method of manufacturing an interposer, comprising:
    providing a sheet with a conductor layer and an insulating layer;
    drilling holes in the insulating layer down to the conductive layer;
    applying conductor to selected portions of the sheet to fill the holes and create conductive caps above the insulating layer, the conductive caps having a diameter at least about 40% greater than a diameter of the holes the conductive caps having a substantial circular cross-section;
    removing portions of the conductive layer to form conductive pads having a substantially capsule-shaped cross-section defined by first and second semicircular end regions and a rectangular region therebetween; and
    filling gaps between the conductive pads with an insulator;
    wherein individual conductive pads are in electrical contact with corresponding individual conductive caps through the insulating layer; and
    wherein each of the holes is substantially coaxial with the first semicircular end region of each of the conductive pads, respectively.

13. The method of claim 12, wherein the conductive caps are mushroom shaped.

14. The method of claim 12, wherein the conductive caps are flat.

15. The method of claim 12, wherein said applying comprises:
    applying a photoresist layer to said insulating layer;
    masking the photoresist layer to create a pattern of caps concentric about the holes;
    removing a portion of the photoresist layer to create recesses over the holes; and
    filling the holes and recess with a conductor.

16. The method of claim 12, wherein the holes have a substantial circular cross-section along their entire length.

17. The method of claim 12, wherein the copper extensions are centered on the holes, and the conductive pads are off center from the holes.

18. The method of claim 12, wherein said insulating layer is polyimide.

19. The method of claim 12, wherein said conductive layer is copper.

20. The method of claim 12, wherein the holes and the first semicircular regions have substantially the same diameter.

21. The method of claim 20, wherein:
    the holes define a grid; and
    the conductive pads are aligned in parallel at a non-zero angle to the axes of the grid.

* * * * *